(12) United States Patent
Liang et al.

(10) Patent No.: US 11,387,380 B2
(45) Date of Patent: Jul. 12, 2022

(54) FLAT PANEL DETECTOR AND MANUFACTURING METHOD THEREOF

(71) Applicants: BEIJING BOE TECHNOLOGY DEVELOPMENT CO., LTD., Beijing (CN); BOE TECHNOLOGY GROUP CO., LTD., Beijing (CN)

(72) Inventors: Kui Liang, Beijing (CN); Dali Liu, Beijing (CN); Jiangbo Chen, Beijing (CN); Shuo Zhang, Beijing (CN); Fan Li, Beijing (CN); Da Li, Beijing (CN)

(73) Assignees: BEIJING BOE TECHNOLOGY DEVELOPMENT CO., LTD., Beijing (CN); BOE TECHNOLOGY GROUP CO., LTD., Beijing (CN)

(*) Notice: Subject to any disclaimer, the term of this patent is extended or adjusted under 35 U.S.C. 154(b) by 146 days.

(21) Appl. No.: 16/765,476

(22) PCT Filed: Dec. 24, 2019

(86) PCT No.: PCT/CN2019/127910
§ 371 (c)(1),
(2) Date: May 20, 2020

(87) PCT Pub. No.: WO2020/253188
PCT Pub. Date: Dec. 24, 2020

(65) Prior Publication Data
US 2022/0037550 A1    Feb. 3, 2022

(30) Foreign Application Priority Data

Jun. 17, 2019   (CN) .......................... 201910521627.4

(51) Int. Cl.
*H01L 31/119*    (2006.01)
*H01L 27/144*    (2006.01)
(Continued)

(52) U.S. Cl.
CPC ........ *H01L 31/119* (2013.01); *H01L 27/1443* (2013.01); *H01L 31/022408* (2013.01); *H01L 31/202* (2013.01)

(58) Field of Classification Search
CPC ........... H01L 31/119; H01L 31/022408; H01L 31/202; H01L 27/1443
See application file for complete search history.

(56) References Cited

U.S. PATENT DOCUMENTS

2006/0062352 A1* 3/2006 Nomura ............ H01L 27/14603
378/98.8
2016/0190225 A1* 6/2016 Kim .................... H01L 51/5228
257/40
(Continued)

FOREIGN PATENT DOCUMENTS

CN          105097860 A  * 11/2015  ......... H01L 27/1461
CN          109276268 A      1/2019
WO   WO-2018212698 A1 * 11/2018  ............. G01T 1/241

OTHER PUBLICATIONS

CN First Office Action in Application No. 201910521627.4, dated Oct. 26, 2020.

*Primary Examiner* — Sitaramarao S Yechuri
(74) *Attorney, Agent, or Firm* — Syncoda LLC; Feng Ma

(57) ABSTRACT

A flat panel detector includes a base substrate, a sensing electrode and a bias electrode over the base substrate, and an insulating layer over the sensing electrode and the bias electrode at a side distal from the substrate. A difference between thicknesses of regions of the insulating layer corresponding to the sensing electrode and the bias electrode respectively is not greater than a preset threshold. When a sufficiently high voltage is applied to the insulating layer and turned on, because the thickness thereof is relatively uniform, a dark current generated by the sensing electrode and the bias electrode under the insulating layer is relatively (Continued)

uniform, thereby improving detection accuracy of the flat panel detector.

15 Claims, 5 Drawing Sheets

(51) Int. Cl.
*H01L 31/0224* (2006.01)
*H01L 31/20* (2006.01)

(56) References Cited

U.S. PATENT DOCUMENTS

2017/0018588 A1* 1/2017 Karim .................. A61B 6/4233
2021/0327946 A1* 10/2021 Guo ..................... H04N 5/3745

* cited by examiner

FLAT PANEL DETECTOR AND MANUFACTURING METHOD THEREOF

CROSS-REFERENCE TO RELATED APPLICATIONS

The present application is a national stage of International Application No. PCT/CN2019/127910 filed on Dec. 24, 2019, which claims priority to Chinese Patent Application No. 201910521627.4 filed on Jun. 17, 2019. The disclosures of these applications are hereby incorporated by reference in their entirety.

FIELD

The disclosure relates generally to the field of photoelectric detection technologies, and more specifically to a flat panel detector and a manufacturing method thereof.

BACKGROUND

MSM (Metal-Semiconductor-Metal) type X-ray (X-ray) sensor refers to a detector of metal-semiconductor-metal interdigital electrode, with a polyimide (PI) insulating layer being filled between the metal interdigital electrode and the semiconductor layer. Under the illumination condition, the semiconductor of the detector receives light, generates electric charge internally, and the resistance is greatly reduced, thereby converting the optical signal into an electrical signal through the photovoltaic effect, and the external bias at this time is mostly applied to the PI layer with high resistance. When the voltage is high enough, the PI film can be turned on by the F-N tunneling effect of the electron, and the electrical signal generated in the semiconductor material can be read and stored by turning on and off the thin film transistor (TFT), thereby achieving the detection purpose.

SUMMARY

Various embodiments of the present disclosure provide a flat panel detector, and a manufacturing method thereof.

In a first aspect, a flat panel detector is provided, including:
a base substrate;
a sensing electrode over the substrate;
a bias electrode over the substrate; and
an insulating layer over the sensing electrode and the bias electrode at a side distal from the base substrate;
wherein:
the sensing electrode and the bias electrode are supported by the insulating layer;
a difference between a thickness of a region of the insulating layer corresponding to the sensing electrode and a thickness of a region of the insulating layer corresponding to the bias electrode is not greater than a preset threshold;
the thickness of the region of the insulating layer corresponding to the sensing electrode is a distance between a surface of the sensing electrode distal from the base substrate and a surface of the insulating layer distal from the base substrate;
the thickness of the region of the insulating layer corresponding to the bias electrode is a distance between a surface of the bias electrode distal from the base substrate and the surface of the insulating layer distal from the base substrate; and
a thickness of the sensing electrode is smaller than a thickness of the bias electrode.

In some embodiments, a distance between a surface of the insulating layer being opposite from the base substrate and the base substrate is uniform.

In some embodiments, a distance between a surface of the sensing electrode adjacent to the base substrate side and the base substrate is greater than a distance between a surface of the bias electrode close to the base substrate side and the base substrate.

In some embodiments, the thickness of the sensing electrode is a distance between a surface of the sensing electrode adjacent to the base substrate and a surface opposite from the base substrate, and the thickness of the bias electrode is a distance between a surface of the bias electrode adjacent to the base substrate and a surface opposite from the base substrate.

In some embodiments, a work function of a material of a portion of the bias electrode in contact with the insulating layer is greater than a work function of a material of a portion of the sensing electrode in contact with the insulating layer.

In some embodiments, the bias electrode includes a first conductive sublayer and a second conductive sublayer located on a side of the first conductive sublayer being opposite from the base substrate, and the first conductive sublayer is disposed in the same layer and is formed of the same material as the sensing electrode.

In some embodiments, the material of the second conductive sublayer has a work function that is greater than a work function of the material of the first conductive sublayer.

In some embodiments, the flat panel detector further includes a thin film transistor and a channel shielding layer, the thin film transistor is located on the base substrate, the channel shielding layer is located on a side of the thin film transistor being opposite from the base substrate, the channel shielding layer is configured to block a channel region of the thin film transistor, the sensing electrode and the bias electrode are located on a side of the channel shielding layer being opposite from the base substrate, and an orthographic projection of the channel shielding layer on the base substrate overlaps at least a portion of an orthographic projection of the sensing electrode on the base substrate.

In some embodiments, the flat panel detector further includes a semiconductor layer, wherein the semiconductor layer is located on a side of the insulating layer being opposite from the substrate.

In some embodiments, the flat panel detector further includes a storage electrode, the storage electrode being located between the base substrate and the sensing electrode, and the sensing electrode and the storage electrode forming a plate capacitor.

In some embodiments, the predetermined threshold is not less than 0 and not more than 35 nm.

In another aspect, a flat panel detector manufacturing method is provided, including:
providing a base substrate;
forming a bias electrode and a sensing electrode over the base substrate; and
forming an insulating layer over the bias electrode and the sensing electrode;
wherein a thickness of the sensing electrode is smaller than the thickness of the bias electrode and wherein a difference between a thickness of a region of the insulating layer corresponding to the sensing electrode and a thickness of a region corresponding to the bias electrode is not greater than a preset threshold, wherein a thickness of a region of the insulating layer corresponding to the sensing electrode is a distance between a surface of the sensing electrode, and a thickness of a region of the insulating layer corresponding to the bias electrode is a distance between a surface of the bias electrode being opposite from the base substrate.

In some embodiments, the manufacturing of the bias electrode and the sensing electrode on the base substrate includes:

forming a sensing electrode and a bias electrode on the base substrate, the difference between a distance between a surface of the sensing electrode being opposite from the base substrate, and a distance between a surface of the bias electrode being opposite from the base substrate is not greater than the preset threshold.

In some embodiments, the insulating layer is formed on a side of the bias electrode and the sensing electrode being opposite from the base substrate, including:

forming an insulating layer on a side of the bias electrode and the sensing electrode being opposite from the base substrate, and a distance between a surface of the insulating layer being opposite from the base substrate and the base substrate is uniform.

In some embodiments, making bias electrode and sensing electrode on the base substrate includes:

forming a sensing electrode on the base substrate;

forming a bias electrode on the base substrate with a material having a work function larger than that of the sensing electrode, such that a material of a portion of the bias electrode in contact with the insulating layer has a work function greater than the work function of a material of the portion of the sensing electrode in contact with the insulating layer.

In some embodiments, the bias electrode includes a first conductive sublayer and a second conductive sublayer, and the bias electrodes and sensing electrodes are formed on the base substrate, including:

forming a first film layer on the base substrate with a first material;

forming the first film layer into the sensing electrode and the first conductive sublayer by a patterning process of one-time pattern;

forming, by the second material, a second film layer on a side of the first conductive sublayer being opposite from the base substrate, wherein a work function of the second material is greater than a work function of the first material;

wherein, the second film layer is subjected to a patterning process to form the second conductive sublayer, wherein the first conductive to sublayer and the second conductive sublayer constitute a bias electrode.

In another aspect, a flat panel detector is provided, including:

a base substrate;

a sensing electrode over the base substrate;

a bias electrode over from the base substrate;

an insulating layer over the sensing electrode and the bias electrode;

a semiconductor layer, the semiconductor layer is located on a side of the insulating layer being opposite from the substrate; and a storage electrode, the storage electrode being located between the base substrate and the sensing electrode, and the sensing electrode and the storage electrode forming a plate capacitor;

wherein:

the sensing electrode and the bias electrode are supported by the insulating layer, a difference between a thickness of a region of the insulating layer corresponding to the sensing electrode and a thickness of a region of the insulating layer corresponding to the bias electrode is not greater than a preset threshold, the thickness of the region of the insulating layer corresponding to the sensing electrode is a distance between a surface of the sensing electrode being opposite from the base substrate, a thickness of a region of the insulating layer corresponding to the bias electrode relates to a distance between a surface of the bias electrode being opposite from the base substrate;

the difference of a distance between a surface of the sensing electrode being opposite from the base substrate side and the base substrate and a distance between a surface of the bias electrode being opposite from the base substrate and the base substrate is not greater than the predetermined threshold;

the thickness of the sensing electrode is smaller than the thickness of the bias electrode;

a thickness of the insulating layer being described as a distance between a surface of the insulating layer being opposite from the base substrate and the base substrate is uniform;

a distance between a surface of the sensing electrode adjacent to the base substrate side and the base substrate is greater than a distance between a surface of the bias electrode close to the base substrate side and the base substrate;

the thickness of the sensing electrode is a distance between a surface of the sensing electrode adjacent to the base substrate and a surface opposite from the base substrate, and the thickness of the bias electrode is a distance between a surface of the bias electrode adjacent to the base substrate and a surface opposite from the base substrate; and a work function of a material of a portion of the bias electrode in contact with the insulating layer is greater than a work function of a material of a portion of the sensing electrode in contact with the insulating layer.

In some embodiments, the bias electrode includes a first conductive sublayer and a second conductive sublayer located on a side of the first conductive sublayer being opposite from the base substrate, and the first conductive sublayer is disposed in the same layer and is formed of the same material as the sensing electrode.

In some embodiments, the material of the second conductive sublayer has a work function that is greater than a work function of the material of the first conductive sublayer.

In some embodiments, the flat panel detector further includes a thin film transistor and a channel shielding layer, the thin film transistor is located on the base substrate, the channel shielding layer is located on a side of the thin film transistor being opposite from the base substrate, the channel shielding layer is configured to block a channel region of the thin film transistor, the sensing electrode and the bias electrode are located on a side of the channel shielding layer being opposite from the base substrate, and wherein an orthographic projection of the channel shielding layer on the base substrate overlaps at least a portion of an orthographic projection of the sensing electrode on the base substrate.

In some embodiments, the predetermined threshold is not less than 0 and not more than 35 nm.

It should be noted that the above general description and the following detailed description are merely exemplary and explanatory and should not be construed as limiting of the present disclosure.

BRIEF DESCRIPTION OF THE DRAWINGS

In order to more clearly illustrate the technical solutions of the embodiments of the present disclosure, the drawings used in the description of the embodiments of the present disclosure will be briefly described below. It is obvious that the drawings in the following description are only some embodiments of the present disclosure. For those of ordinary skill in the art, other drawings may be obtained from these drawings without the inventive labor.

DETAILED DESCRIPTION

Figure 1:
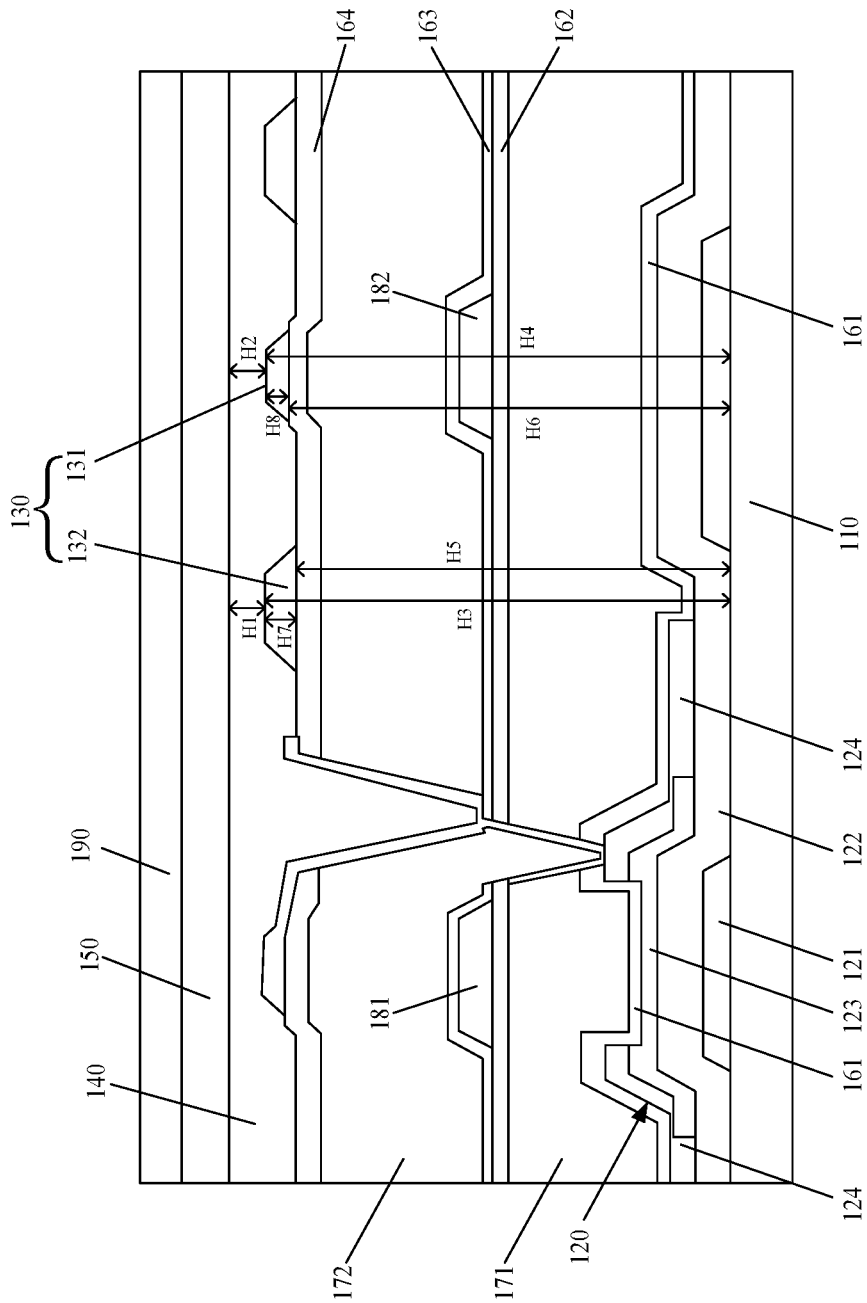
FIG. 1 is a schematic structural view of a flat panel detector according to an embodiment of the present disclosure.

Hereinafter, embodiments of the present disclosure will be described in detail. Examples of the embodiments are shown in the drawings, wherein the same or similar reference numerals indicate the same or similar elements or elements having the same or similar functions. The embodiments described below with reference to the drawings are exemplary and are intended to explain the present disclosure, but are made for exemplary purposes only and as such should not be construed as limiting the present disclosure.

Dark current distributions of flat panel detectors can often be uneven, affecting their detection accuracies. A flat panel detector provided by some embodiments of the present disclosure can address this problem.

As shown in FIG. 1, the flat panel detector can include a base substrate 110, a thin film transistor 120, a sensor (Sense) electrode 131, a bias electrode (Bias) 132, an insulating layer 140, and a semiconductor layer 150.

The base substrate 110 in this embodiment can be provided utilizing a substrate made of a glass substrate or an organic material, or any other suitable base substrate material as will be appreciated by those having skill in the art.

The thin film transistor 120 can be located on the base substrate 110, the sensing electrode 131 and the bias electrode 132 can then be located on a side of the thin film transistor 120 being opposite from the base substrate 110, and the insulating layer 140 can be located at an opposing side of the sensing electrode 131 and the bias electrode 132 from the base substrate 110. Finally, the semiconductor layer 150 can then be disposed on an opposing side of the insulating layer 140 from the substrate 110.

The thin film transistor 120 as illustrated here can be configured to read and store electrical signals. Specifically, the semiconductor layer 150 having a light-sensitive semiconductor which is sensitive to the signal being detected. Specifically, if the flat panel detector is being utilized to detect X-rays, an X-ray sensitive semiconducting material is selected, and if used for detecting ultraviolet light, an ultraviolet-sensitive material would then be selected, and when implemented, the appropriate materials are selected according to actual needs based on a given implementation.

For purposes of illustration, under the condition of illumination, a charge is generated in the semiconductor layer 150, and the associated resistance of the semiconductor layer 150 changes in response to the illumination presented thereto. In other words, the optical signal is received by the semiconductor layer 150, wherein the optical signal is converted into an electrical signal by the photovoltaic effect. In such an instance, the intensity of the electrical signal changes in a correlative manner with the change of the illumination intensity on the semiconductor layer 150.

Then, utilizing the bias electrode 132 a bias voltage can be provided or generated by the system. Since the external bias voltage is a relatively high voltage, the bias electrode 132 can also referred to as a high voltage (HV) electrode.

In use, a bias voltage can be first provided by the bias electrode 132. An appropriate size of the bias voltage will be recognized by those having skill in the art. The bias voltage can then be primarily applied to the insulating layer 140 having a high resistance. The material of the insulating layer 140 as illustrated here can include one or more of the following: Polyimide (PI), polyurethane, poly (p-phenylene terephthalamide), and polyamideimide.

When the voltage is sufficiently high, the insulating layer 140 can be turned on by the F-N tunneling effect of the electrons, and the electrical signal generated in the semiconductor layer 150 can be detected by the sensing electrode 131. In this manner the signal can be read and stored by the turning on and off of the thin film transistor 120 to achieve the purpose of detection.

Figure 2:
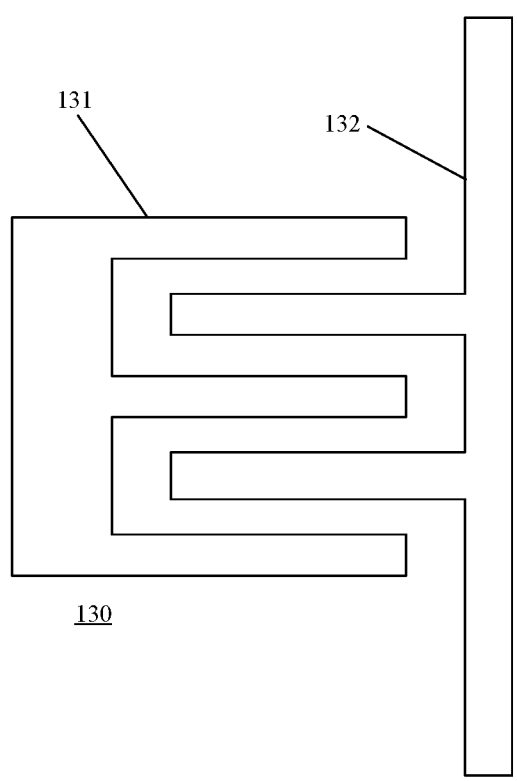
FIG. 2 is a schematic structural view of a flat panel detector in the related art.

As shown in FIG. 2, a sensing electrode pattern 131 and the bias electrode (Bias) 132 can together be configured to constitute a structure of the interdigital electrode 130, and the sensing electrode 131 can then be electrically connected to the thin film transistor 120 so as to realize electrical signal transmission.

As illustrated here, the distribution of the structures on the base substrate 110 can cause or otherwise allow for a certain difference in the heights of the sensing electrodes 131 and the bias electrodes 132. Here, the heights of the sensing electrodes 131 and the bias electrodes 132 refer to the respective distances between the surface of the sensing electrode 131 and the bias electrode 132 away from the base substrate 110.

Figure 3:
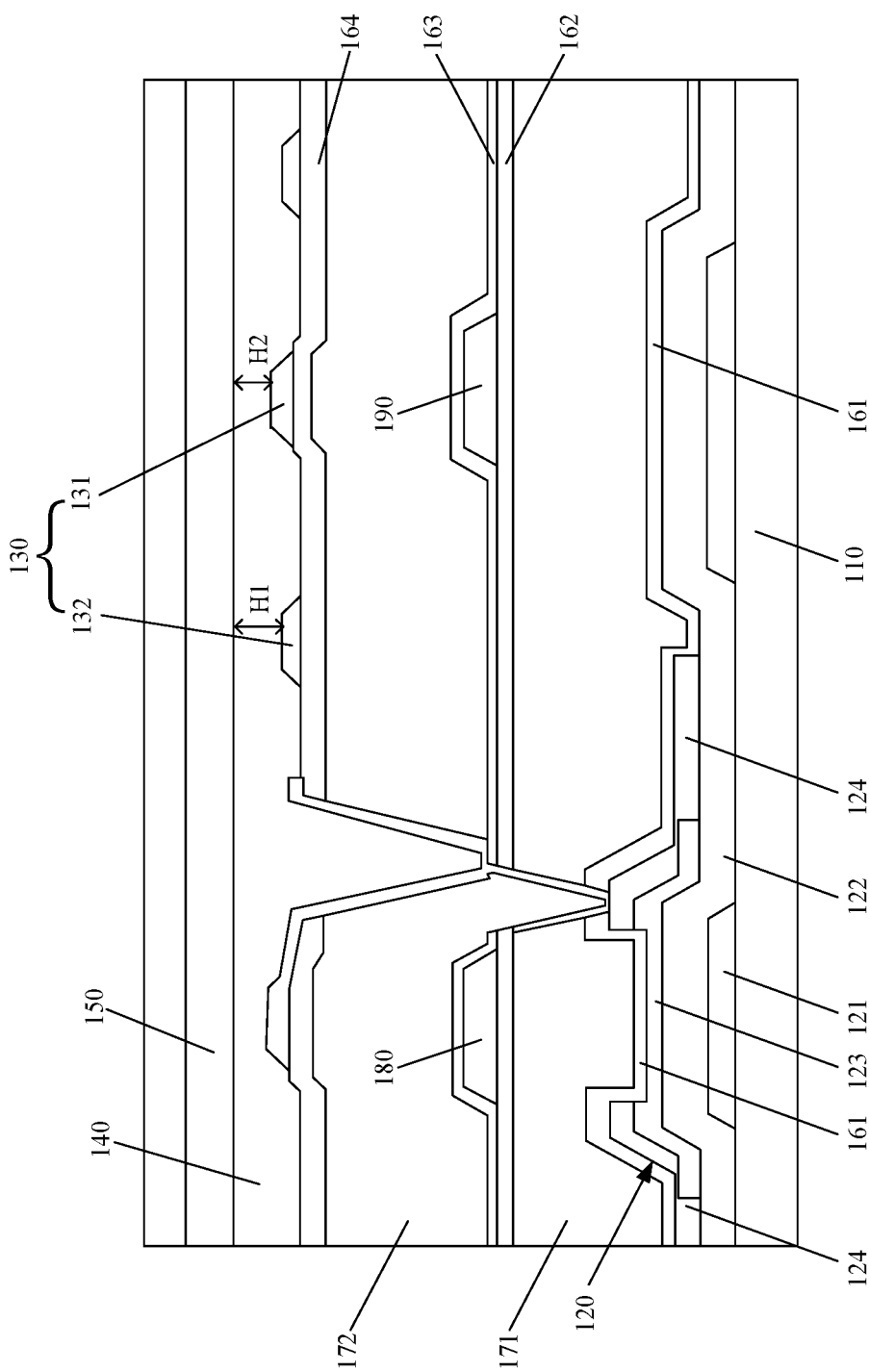
FIG. 3 is a schematic structural diagram of another flat panel detector according to an embodiment of the present disclosure.
Figure 4:
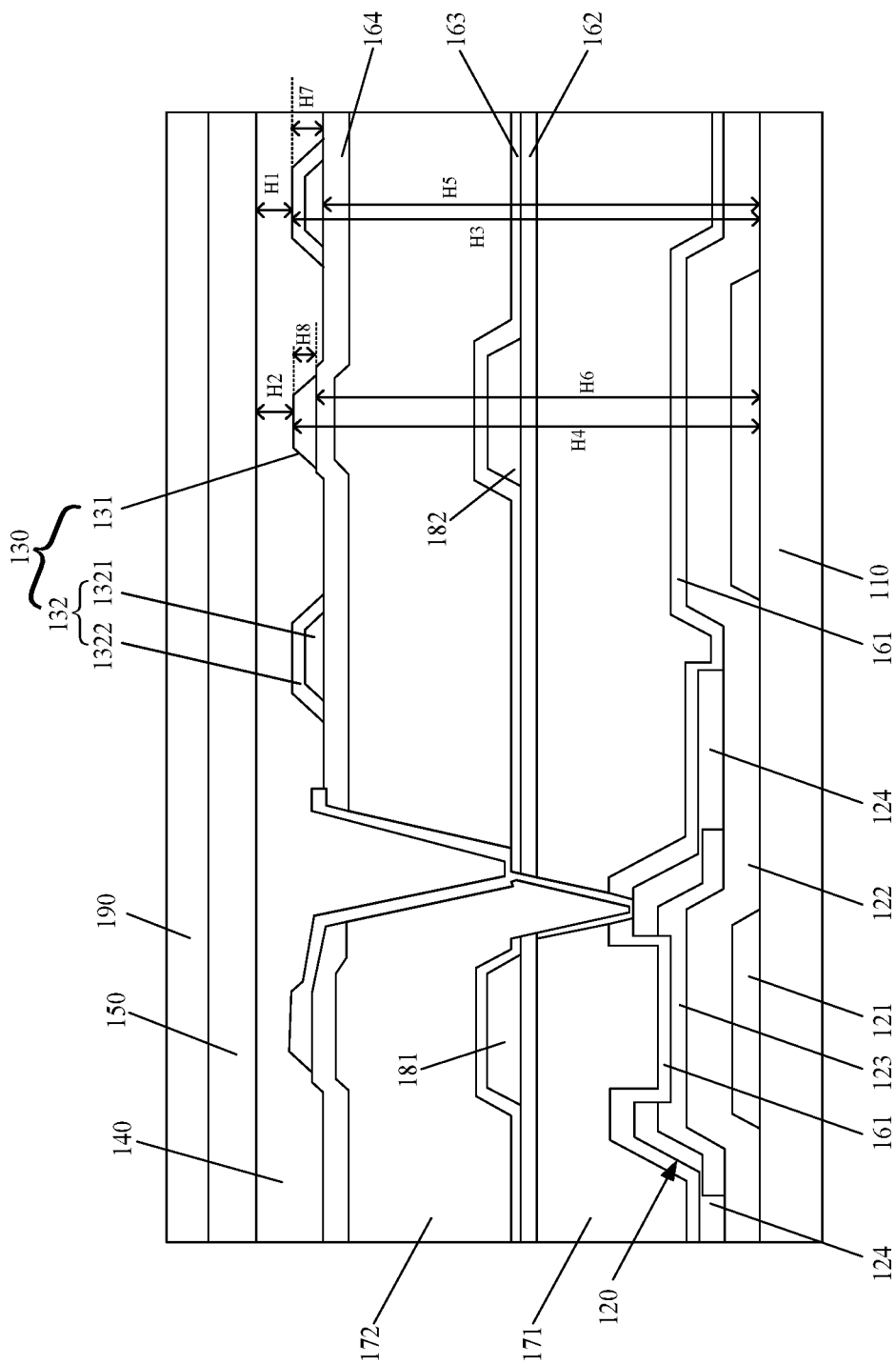
FIG. 4 is a schematic structural view of an interdigital electrode in an embodiment of the present disclosure.

With reference to FIG. 1, FIG. 3 and FIG. 4, a structure is illustrated in which the thin film transistor 120, the channel shielding layer 181, the storage electrode 182, and the like exist between the sensing electrode 131 and the base substrate 110. This structure allows for a relative positioning in which the height of the sensing electrode 131 is slightly above the height of the bias electrode 132. As contemplated herein, this height difference can be provided being around 500 Å to 700 Å (1 Å=0.1 nm) in actual production.

In the related art, the sensing electrode 131 and the bias electrode 132 are disposed on the same layer with the same material, that is, the thickness of the base substrate is equal in the direction perpendicular to the base substrate 110, so there is typically zero, or a negligible, height difference between the heights of the sensing electrode 131 and the bias electrode 132.

When the insulating layer 140 is formed, the heights of the upper surfaces of the insulating layer 140 are substantially the same. Here, the upper surface of the insulating layer 140 refers to the side surface of the insulating layer 140 opposite from the base substrate 110, and the height of the upper surface refers to the distance between the upper surface and the base substrate 110.

That is, the distance between the surface of the insulating layer 140 being opposite from the base substrate 110 and the base substrate 110 is substantially equal, such that a certain thickness difference are present between the portion of the insulating layer 140 corresponding to the sensing electrode 131 and the portion corresponding to the bias electrode 132.

As illustrated in FIG. 2, H1 refers to the thickness of the insulating layer 140 corresponding to the bias electrode 132, and H2 refers to the thickness of the insulating layer 140 corresponding to the sensing electrode 131. As can be seen from the figure, H2 is greater than H1. The difference in thickness between the two respective portions of the insulating layers 140 also corresponds to the difference between H2 and H1. It will then be appreciated that in this embodiment the difference in thickness is equal to the difference in height between the sensing electrode 131 and the bias electrode 132.

Thus, since the height of the sensing electrode 131 is higher than the height of the bias electrode 132, the thickness of the insulating layer 140 corresponding in location with the sensing electrode 131 is also lower than the thickness of the insulating layer 140 corresponding in location with the bias electrode 132.

In the case where the materials and the like are the same, the resistance of the structure increases as the length increases, that is, wherein length refers to length in the direction perpendicular to the base substrate 110. In such situations, the resistance of the insulating layer 140 is different for the region corresponding to the sensing electrode 131 and the region corresponding to the bias electrode 132. Similarly, the resistance of the insulating layer 140 is larger at the bias electrode 132, and the resistance of the insulating layer 140 is relatively small at the sensing electrode 131, so that the thickness of the insulating layer 140 is uneven and therefore the resistance is not uniform. Thus, in the case where the current (or photocurrent) generated by the X-ray irradiation of the semiconductor layer 150 is the same, the uneven thickness of the insulating layer 140 may cause the current (or dark current) detected by the interdigital electrode 130 to also be correspondingly uneven.

In this embodiment, the difference between the thickness of the region corresponding to the sensing electrode 131 and that of the region corresponding to the bias electrode 132 is not greater than a preset threshold. It will also be understood that, in implementation, the difference between the thickness H1 and the thickness H2 shown in FIG. 1 and FIG. 4 is controlled so as to not exceed a preset threshold.

It should be understood that the smaller the thickness difference between the regions of the insulating layer 140 corresponding to the sensing electrode 131 and the bias electrode 132 will then correspond to an associated smaller preset threshold. Correspondingly, the smaller the difference of the resistance is, the higher the degree of uniformity of the dark current will be.

In these embodiments of the present disclosure, the difference between the thicknesses of the insulating layers 140 corresponding to the regions associated with sensing electrodes 131 and the regions associated with bias electrodes 132 is not greater than a predetermined threshold, so that when a sufficiently high voltage is applied to the insulating layer 140 and turned on by the FN tunneling effect of the electrons, because the thickness is relatively uniform, the dark current generated by the interdigital electrode 130 under the insulating layer 140 is relatively uniform, thereby improving the uniformity of the dark current distribution of the flat panel detector and contributing to the improvement of the detection precision of the flat panel detector.

In some implementations, due to factors presented by the manufacturing process, it may be difficult to make the above thickness difference 0, but the thickness difference should be reduced as much as possible. In an optional implementation manner, the preset threshold can be set to be greater than 0 and not greater than 35 nanometers, and further, for example, may be set to 30 nanometers, 28 nanometers, 25 nanometers, 20 nanometers, 10 nanometers, etc. kind of value, obviously, the smaller the preset threshold, the more it helps to improve the uniformity of dark current.

Alternatively, in some embodiments, the adjustment of the thickness of the insulating layer 140 is achieved by adjusting the heights of the sensing electrode 131 and the bias electrode 132.

Specifically, referring to FIG. 1 or FIG. 4, H4 is the distance between the surface of the sensing electrode 131 being opposite from the base substrate 110 and the base substrate 110, and H3 is the distance between the surface of the bias electrode 132 being opposite from the base substrate 110 and the base substrate 110.

The difference between H3 and H4 can be optimized such that it is not greater than a predetermined threshold, and the distance between the surface of the insulating layer 140 being opposite from the base substrate 110 and the base substrate 110 is made uniform.

Further, referring to FIG. 1 and FIG. 4, H6 refers to the distance between the surface of the sensing electrode 131 adjacent to the base substrate 110 and the base substrate 110, and H5 refers to the distance between the surface of the bias electrode 132 adjacent to the base substrate 110 and the base substrate 110. It will then be appreciated that as illustrated here, H6 is greater than H5.

It should be understood that due to the limitation of the production process and the like, the thin film transistor 120, the channel shielding layer 181, the storage electrode 182 and the like are also between the sensing electrode 131 and the base substrate 110, so that H6 is larger than H5. In general, the difference is usually around 500 Å to 700 Å. It will then be understood that the difference can vary due to inconsistencies or variations in manufacturing processes.

In this embodiment, the thickness of the insulating layer 140 in the regions corresponding to the sensing electrode 131 and the bias electrode 132 can be controlled so as to achieve uniform thickness of the insulating layer 140. For example, an insulating layer 140 having a uniform thickness can be formed in the regions corresponding to the sensing electrode 131 and the regions corresponding with the bias electrode 132.

It should be noted that the distance between the surface of the insulating layer 140 away from the base substrate 110 side and the base substrate 110 is uniform, which means that the distance between each point on the surface of the insulating layer 140 opposite from the base substrate 110 and the base substrate 110 is substantially equal.

It can also be understood that, in the case of ignoring a certain error, it can be considered that the surface of the insulating layer 140 being opposite from the base substrate 110 is substantially parallel to the base substrate 110. For example, the target distance L between the surface of the insulating layer 140 opposite from the base substrate 110 and the base substrate 110 is 0 nm, the processing error is 2 nm. In this case, the distance between each point on the surface of the insulating layer 140 opposite from the base substrate 110 and the base substrate 110 then have a maximum value of L+2 nm, and a minimum value of L−2 nm.

Thus, the distance between the surface of the sensing electrode 131 and the bias electrode 132 being opposite from the base substrate 110 and the base substrate 110 directly affects the thickness of the corresponding insulating layer 140.

By controlling the height difference between the sensing electrode 131 and the bias electrode 132 not to be greater than a preset threshold, it is equivalent to controlling the difference in thickness of the insulating layer 140 corresponding to the sensing electrode 131 and the bias electrode 132 to be not greater than a preset threshold.

As also illustrated in these figures, the thickness H8 of the sensing electrode 131 can be configured such that it is smaller than the thickness H7 of the bias electrode 132.

In this embodiment, as shown in FIG. 1 and FIG. 4, the thickness H8 of the sensing electrode 131 represents a distance between a surface, shown here as a lower surface, of the sensing electrode 131 which is facing the base substrate 110 and a surface opposite from the base substrate 110, shown here as an upper surface. In this configuration, the thickness H7 of the bias electrode 132 is a distance between a facing surface, i.e., a lower surface, of the bias electrode 132 which faces the base substrate 110 and a surface opposite from or facing away from the base substrate 110, i.e., the upper surface thereof.

Since the lower surface of the sensing electrode 131 and the lower surface of the bias electrode 132 are not on the same plane, and the distance between the lower surface of the sensing electrode 131 and the base substrate 110 is relatively large, by increasing the thickness H7 of the bias electrode 132, the height difference between the upper surface of the sensing electrode 131 and the upper surface of the bias electrode 132 can thus be reduced.

As shown in FIG. 1, in some embodiments, the sensing electrode 131 and the bias electrode 132 can be separately fabricated. In other words, the sensing electrode 131 can be fabricated first, and then the bias electrode 132 can be fabricated; or the bias electrode 132 can be first fabricated, and then the sensing electrode 131 can be fabricated afterwards. During the manufacturing process, by controlling the thickness of the sensing electrode 131 and the bias electrode 132 the height difference between the sensing electrode 131 and the bias electrode 132 is adjusted. In other words, the thickness of the bias electrode 132 can be made larger than the thickness of the sensing electrode 131 so as to compensate for the difference in heights produced by the formation of the first formed electrode and thereby reduce the difference thereof.

It should be understood that the purpose of controlling the thickness H7 of the bias electrode 132 to be greater than the thickness H8 of the sensing electrode 131 is to reduce the difference of the distance between a surface of the bias electrode 132 being opposite from the base substrate 110 and the base substrate and the distance between a surface of the sensing electrode 131 being opposite from the base substrate 110 and the base substrate 110. Optimally, as illustrated here, the difference between the thickness H7 and H8 is between 500 Å and 700 Å.

The thickness H7 of the bias electrode 132 and the thickness H8 of the sensing electrode 131 should be determined according to actual conditions.

For example, if the distance difference between the sensing electrode 131 and the bias electrode 132 near a surface of the base substrate 110 is 500 Å, and the distance between the sensing electrode 131 and the base substrate 110 is larger, then the thickness of the electrode 132 is controlled to be greater than the thickness of the sensing electrode 131, and the thickness difference can then be controlled to be about 500 Å.

Alternatively, if the distance difference between a surface of the sensing electrode 131 and the bias electrode 132 near the substrate 110 is 700 Å, then it is necessary to control the thickness of the bias electrode 132 is greater than the thickness of the sensing electrode 131, and the difference in thickness is controlled to be about 700 Å. Thus, by increasing the thickness of the bias electrode 132, the distance between the surface of the sensing electrode 131 and the bias electrode 132 being opposite from the base substrate 110 and the base substrate 110 can be made substantially equal. In other words, the height difference of the sensing electrode 131 and the bias electrodes 132 is reduced.

As shown in FIG. 4, in some embodiments, the bias electrode 132 can include a first conductive sublayer 1321 and a second conductive sublayer 1322 which located on an opposing side of the first conductive sublayer 1321 from the substrate 110. The first conductive sublayer 1321 and the second conductive sublayer 1322 can be superimposed, and the first conductive sublayer 1321 can be disposed in the same layer with the same material as the sensing electrode 131.

In this embodiment, the first conductive sublayer 1321 and the sensing electrode 131 of the same layer with the same material can be formed utilizing a first patterning process, and the second conductive sublayer 1322 superposed with the first conductive sublayer 1321 can then be further formed so as to increase the distance between the upper surface of the electrode 132 and the base substrate 110.

The thickness of the second conductive sublayer 1322 can then be determined according to the difference in height between the sensing electrode 131 and the first conductive sublayer, thereby reducing the difference in height between the sensing electrode 131 and the bias electrode 132 through the second conductive sublayer 1322.

As shown in FIG. 4, in this case, the thickness H7 of the bias electrode 132 can correspond with the sum of the thicknesses of the first conductive sublayer 1321 and the second conductive sublayer 1322.

Further, as an optional specific embodiment, the work function, i.e., the minimum energy required to extract one electron from the material, of the material of the portion relating to the location of the bias electrode 132 in contact with the insulating layer 140 in these embodiments is greater than the work function of the material of the portion relating to the location where the sensing electrode 131 is in contact with the insulating layer 140. Under the same conditions, the electron injection barrier can be increased, the dark current can be reduced, the sensitivity of detection can be improved, and the signal-to-noise ratio can be improved, thereby improving the quality of the detected signal.

In this embodiment, the greater the difference between the work functions of the two, the more the dark current is reduced. In a specific embodiment, the difference between the work functions of the two is not less than 0.5, which can effectively reduce the dark current and improve the accuracy of the detection. In a preferred embodiment, the difference in work function between the two is not less than 1, which can further reduce the dark current and improve the accuracy of the detection result.

In some embodiments, the sensing electrode 131 and the bias electrode 132 can be fabricated from different materials. For example, titanium can be utilized, which has a work function 3.9, so as to form the sensing electrode 131, and copper, which has a work function 4.65, or aluminum, which has a work function 4.4, can be selected to form the bias electrode 132. Alternatively, the aluminum can be made into the sensing electrode 131, and platinum, having a work function 5.65, can be selected to form the bias electrode 132.

In this way, it is possible to increase the work function of the bias electrode 132 so as to reduce the dark current. It will be appreciated that the selection of the material in these specific embodiments is not intended to be limiting, but only made by way of example, wherein any number of appropriate materials with associated appropriate work functions can be selected, as will be understood by those having skill in the art. It is only meant to show that it is sufficient that the work function of the material of the bias electrode 132 is made larger than the material of the sensing electrode 131 under the premise of meeting other particular applicable requirements.

In some embodiments, the bias electrode 132 can include a first conductive sublayer 1321 and a second conductive sublayer 1322. In some such instances, when the first conductive sublayer 1321 and the sensing electrode 131 are disposed in the same layer with the same material, a material having a work function greater than that of the first conductive sublayer 1321 can then be selected so as to form a second conductive sublayer 1322 on the first conductive sublayer 1321. Then, the effect of reducing dark current can thus be achieved, and at the same time, this helps to improve the sensitivity of detection, and contributes to improve the signal-to-noise ratio and improve the quality of the detected signal.

Referring to FIG. 1 and FIG. 4, in some embodiments, the flat panel detector can further include a thin film transistor 120, a channel shielding layer 181, a storage electrode 182, and a semiconductor layer 150.

The thin film transistor 120 can then be disposed on the base substrate 110. The thin film transistor 120 can then include a gate pattern 121 on the base substrate 110, a gate insulating layer 122 on the gate pattern 121, a gate insulating layer 122, an active layer pattern 123, and the source and drain electrode pattern 124 on the active layer pattern 123. The thin film transistor 120 can then be used for reading and storing electrical signals by turning on and off, thereby achieving the purpose of detection.

As illustrated here, the channel shielding layer 181 can be disposed on a side of the thin film transistor 120 being opposite from the substrate 110 and can then be positioned in a manner corresponding to a channel region of the thin film transistor 120. The channel shielding layer 181 can then be configured to block a channel region of the thin film transistor 120 so as to reduce the possibility of direct illumination of the thin film transistor 120.

In situations in which the light is directly irradiated onto the thin film transistor 120, the characteristics of the thin film transistor 120 may be drifted, resulting in abnormality of the detected data and aging of the device under illumination. Reduction in the possibility that the light is directly irradiated on the thin film transistor 120 can be achieved by providing the channel shielding layer 181. This reduction in direct irradiation contributes to improving the stability of the device.

Additionally, the orthographic projection of the sensing electrode 132 on the base substrate 110 can be configured such that it coincides with at least a portion of the orthographic projection of the channel shielding layer 181 on the base substrate 110.

However, the channel shielding layer 181 may also cause the height of the sensing electrode 132 to increase.

In some embodiments, and as shown here, the sensing electrode 131 and the bias electrode 132 can be located on a side of the channel shielding layer 181 being opposite from the substrate 110. Additionally, the storage electrode 182 can be located between the base substrate 110 and the interdigital electrode 130. In this manner, the sensing electrode 131 and the storage electrode 182 form a plate capacitor to store the charge. The storage electrode 182 also serves as a common electrode of the flat panel detector, and may be, for example, a negative electrode (GND).

As also illustrated here, in some embodiments, the semiconductor layer 150 can be located on a side of the insulating layer 140 being opposite from the base substrate 110, and the semiconductor layer 150 may be made of a light sensitive material such as a-Si (amorphous silicon).

Referring to FIG. 1 and FIG. 4, the flat panel detector can further include some other functional film layers, such as a first buffer layer 161 (buffer1) and a first organic layer 171 (resin1), which can be provided on the thin film transistor 120.

Additionally, a second buffer layer 162 (buffer2) can be provided on the organic layer 171, and a third buffer layer 163 (buffer3) can be provided on the second buffer layer 162 each respectively covering the channel shielding layer 181 and the storage electrode 182.

Then, a second organic layer 172 (resin 2) can be provided on the third buffer layer 163 and a fourth buffer layer 164 (buffer4) can be provided on the second organic layer 172 on the side of the interdigital electrode 130 near the base substrate 110. Finally, a protective layer (PVX) 190, etc. can be provided which can be located on a side of the semiconductor layer 150 being opposite from the base substrate.

In some additional embodiments of the present disclosure can also provide an electronic device which can implement the flat panel detector according to any of the embodiments as discussed above.

For example, in the case where the flat panel detector is configured to detect X-rays, the electronic device may be an X-ray device including an X-ray emitter and the above-described flat panel detector. In addition, it can be an X-ray detecting device or the like, which is provided as an exemplary embodiment for purposes of discussion and not intended to be limiting herein. The technical solution of these embodiments includes all the technical solutions of the foregoing embodiments, so that at least all the technical effects described above can be implemented, and details are not described herein again.

Also contemplated herein includes a method of fabricating a flat panel detector as will be discussed below and in reference to FIG. 5.

Figure 5:
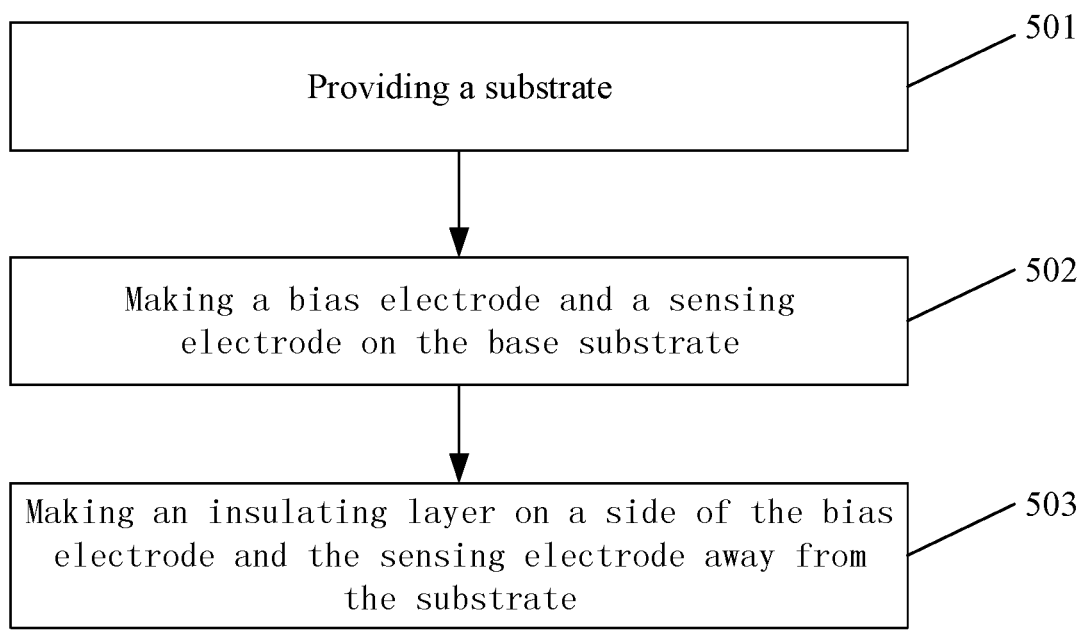
FIG. 5 is a flowchart of a method for manufacturing a flat panel detector according to an embodiment of the present disclosure.

As shown in FIG. 5, the method for manufacturing the flat panel detector can include the following steps:

Step 501: Providing a base substrate.

Step 502: fabricating a bias electrode and a sensing electrode on the base substrate.

Step 503: forming an insulating layer on a side of the bias electrode and the sensing electrode being opposite from the base substrate.

In these embodiments, the difference between the thickness of the region corresponding to the sensing electrode 131 and the region corresponding to the bias electrode 132 can be provided such that a difference therebetween is not greater than a predetermined threshold.

The thickness of the region of the insulating layer 140 corresponding to the sensing electrode 131 describes the distance between the surface of the sensing electrode 131 being opposite from the base substrate 110 and the surface of the insulating layer 140 being opposite from the base substrate 110.

The thickness of the region of the insulating layer 140 corresponding to the bias electrode 132 can be described as the distance between the surface of the bias electrode 132 being opposite from the base substrate 110 and the surface of the insulating layer 140 being opposite from the base substrate 110.

Next, the manufacturing method of the flat panel detector will be further described in detail.

Referring to FIG. 1 and FIG. 4, in implementations, a thin film transistor 120 for reading and storing electrical signals can be fabricated first. Specifically, a base substrate 110 can be provided, and the material of the base substrate 110 can be any suitable material as will be understood by those having skill in the art and being in possession of this disclosure. Accordingly, a gate metal can then be deposited on the base substrate 110, and then a gate pattern 121 can be formed utilizing a masking process.

It should be understood that the masking process in each step of these embodiments may include steps of photoresist coating, exposure, development, etching, etc., and appropriate additional steps will also be appreciated by those having skill in the art and being in possession of this disclosure, and as such, various potential additional steps will not be further defined and described herein.

After the gate pattern 121 is formed, an insulating material can then be deposited on the gate pattern 121, and then a gate insulating layer (GI) 122 can then be formed utilizing a masking process.

Next, an active layer material can be deposited, and then an active layer pattern 123 can then be formed by utilizing the masking process. After the fabrication of the active layer pattern 123 is completed, the source and drain metal materials can be further deposited, and the source/drain electrode pattern (SD) 124 can be formed by the masking process, thus substantially completing the fabrication of the thin film transistor 120.

Next, the first buffer layer 161 and the first organic layer 171 can be sequentially formed on the thin film transistor 120. After the first organic layer 171 is formed, a Via hole or aperture can be opened or provided at a specific position. Then, a second buffer layer 162 can be formed on the first organic layer 171.

After the fabrication of the second buffer layer 162 is completed, a shield metal and a storage metal can be deposited on the second buffer layer 162. In some such embodiments, the second buffer layer can be formed into a channel shielding layer 181 and a storage electrode 190 by utilizing a masking process. Then, a third buffer layer 163 covering the channel blocking layer 181 and the storage electrode 190 can then be formed above the channel shielding layer 181.

In general, the second buffer layer 162 and the third buffer layer 163 can be provided being formed of the same or a common material, so that the second buffer layer 162 and the third buffer layer 163 can form an integral structure in the contact portion, As illustrated in FIG. 1, the boundary between the second buffer layer 162 and the third buffer layer 163 represents that the second buffer layer 162 and the third buffer layer 163 are fabricated by different steps, and in actual implementation, there may be no obvious actual boundary.

Next, a second organic layer 172 can be formed on the third buffer layer 163, and via holes can then be formed at desired predetermined positions. The material of the first organic layer 171 and the second organic layer 172 in this embodiment may specifically be formed utilizing particular selected resin materials having appropriate characteristics for a given implementation.

The via holes can in some instances be opened twice such that they are utilized to set the traces to realize the electrical connection between the sensing electrodes 131 of the interdigital electrodes 130 and the thin film transistor 120. In some such instances, the electrical signals collected by the interdigital electrodes 130 can be transmitted to the thin film transistor 120. For the setting of the routing, those having skill in the art will understand the proper routing, and, as such, the particular details are not described here.

Next, a fourth buffer layer 164 can be formed on the second organic layer 172, and a sensing electrode 131 and a bias electrode 132 can then be formed on the fourth buffer layer 164.

One associated distance being described as the distance between the surface of the sensing electrode 131 being opposite from the base substrate 110 side and the base substrate 110. A second associated distance can then be described as the distance between the surface of the bias electrode 132 opposite from the base substrate 110 and the base substrate 110. The difference between these two distances is not greater than a preset threshold.

As an optional specific embodiment, the sensing electrode 131 and the bias electrode 132 can be separately fabricated. Specifically, as shown in FIG. 1, a sensor metal pattern can be fabricated by depositing a sensor metal layer utilizing a masking process, and etching, i.e., metal etching, and wherein the bias electrode 132 can then be fabricated by depositing a high voltage electrode metal layer, a masking process, and etching.

In some embodiments, as shown in FIG. 4, the bias electrode 132 can include a first conductive sublayer 1321 and a second conductive sublayer 1322. The step 502 of forming these sublayers then specifically including the steps of:

forming a first film layer on the base substrate 110 using the first material;
wherein the first film layer is formed into the sensing electrode 131 and the first conductive sublayer 1321 by a patterning process of one-time pattern;
forming a second film layer on the side of the first conductive sublayer being opposite from the substrate 110, wherein the second material has a work function greater than a work function of the first material;
wherein the second film layer is patterned to form a second conductive sublayer 1322, wherein the first conductive sublayer 1321 and the second conductive sublayer 1322 constitute the bias electrode 132.

In the implementation, the sensing electrode 131 and the first conductive sublayer 1321 can be first formed by a patterning process of one-time pattern. Specifically, the first film layer can be deposited by using the first material, and then the patterning process of one-time pattern is performed by using a masking process and etching, herein being referred to as one-time patterning process, the sensing electrode 131 and the first conductive sublayer 1321 can then be fabricated.

Further, the second conductive sublayer 1322 can be formed by providing a second material on the side of the first conductive sublayer 1321 being opposite from the base substrate 110, and further the second film layer can then be formed into the second conductive sublayer 1322 by utilizing a patterning process.

Further, as an optional specific embodiment, different materials can be used so that the work function of the material of the portion where the bias electrode 132 is in contact with the insulating layer 140 is greater than the work function of the material of the portion where the sensing electrode 131 is in contact with the insulating layer 140.

Specifically, if the sensing electrode 131 and the bias electrode 132 are separately fabricated, the material having a larger work function than the sensing electrode 131 can be selected when the sensing electrode 131 is fabricated. In the case where the bias electrode 132 includes the first conductive sublayer 1321 and the second conductive sublayer 1322, a material having a larger work function can then be selected to form the second conductive sublayer 1322.

After the fabrication of the sensing electrode 131 and the bias electrode 132 is completed, an insulating material can then be deposited on the interdigital electrode 130 so as to form an insulating layer 140 thereon.

The difference between the thickness of the region of the insulating layer 140 corresponding to the location of the sensing electrode 131 and the thickness of the region of the insulating layer 140 corresponding to the bias electrode 132 in these embodiments is not greater than a preset threshold.

It can also be understood that the difference in thickness between the insulating layer 140 above the sensing electrode 131 and the insulating layer 140 above the bias electrode 132 is less than the predetermined threshold.

When implemented, the control of the thickness of the insulating layer 140 can be achieved by controlling the deposition thickness of the corresponding polyimide material according to different regions.

In an optional specific embodiment, the height of the sensing electrode 131 and the height of the bias electrode 132 can then be controlled such that the height difference between the sensing electrode 131 and the bias electrode 132 is not greater than the predetermined threshold. When the insulating layer 140 is formed, the distance between the surface of the insulating layer 140 opposite from the base substrate 110 can provided in a uniform manner.

In this way, it is also possible to realize that the difference between the thickness of the region of the insulating layer 140 corresponding to the sensing electrode 131 and the thickness of the region of the insulating layer 140 corresponding to the bias electrode 132 is not greater than a preset threshold.

It should be understood that, here, the heights of the sensing electrode 131 and the bias electrode 132 refer to the distance between the surface of the sensing electrode 131 and the bias electrode 132 opposite from the upper surface of base substrate 110.

Next, a semiconductor layer 150 can then be formed on the insulating layer 140, and a protective layer 190 can be formed on the semiconductor layer 150. In some embodiments, the material of the semiconductor layer 150 can be a-Si, and the material of the protective layer 190 can be selected from various inorganic materials, such as silicon nitride.

Various embodiments of the present disclosure can have one or more of the following advantages.

The difference between the thicknesses of the insulating layer corresponding to the sensing electrodes and that of the insulating layer corresponding to the bias electrodes is not greater than a preset threshold, such that when a sufficiently high voltage is applied to the insulating layer to turn on the insulating layer, because the thickness of the insulating layer is relatively uniform, the dark current generated by the sensing electrode and the bias electrode under the insulating layer is relatively uniform, thereby improving the uniformity of the dark current distribution of the flat panel detector, which helps to improve the detection accuracy of the flat panel detector.

The above is only the specific embodiment of the present disclosure, but the scope of the present disclosure is not limited thereto, and any person skilled in the art can easily think of changes or substitutions within the technical scope of the present disclosure. It is within the scope of the disclosure. Therefore, the scope of protection of the present disclosure should be determined by the scope of the claims.

In the present disclosure, it is to be understood that the terms "lower," "upper," "thickness," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, the terms "connected" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in to the art on a case-by-case basis.

In the present disclosure, a first element being "on" a second element may indicate direct contact between the first and second elements, without contact, or indirect through an intermediate medium, unless otherwise explicitly stated and defined.

Moreover, a first element being "above," or at "an upper surface of" a second element may indicate that the first element is directly above the second element, or merely that the first element is at a level higher than the second element. The first element at "a lower surface of" the second element may indicate that the first element is directly below the second element, or merely that the first element is at a level lower than the second feature. The first and second elements may or may not be in contact with each other.

Various embodiments in this specification have been described in a progressive manner, where descriptions of some embodiments focus on the differences from other embodiments, and same or similar parts among the different embodiments are sometimes described together in only one embodiment.

It should also be noted that in the present disclosure, relational terms such as first and second, etc., are only used to distinguish one entity or operation from another entity or operation, and do not necessarily require or imply these entities having such an order or sequence. It does not necessarily require or imply that any such actual relationship or order exists between these entities or operations.

Moreover, the terms "include," "including," or any other variations thereof are intended to cover a non-exclusive inclusion within a process, method, article, or apparatus that comprises a list of elements including not only those elements but also those that are not explicitly listed, or other elements that are inherent to such processes, methods, goods, or equipment.

In the case of no more limitation, the element defined by the to sentence "includes a . . . " does not exclude the existence of another identical element in the process, the method, or the device including the element.

Specific examples are used herein to describe the principles and implementations of some embodiments. The description is only used to help convey understanding of the possible methods and concepts. Meanwhile, those of ordinary skill in the art can change the specific manners of implementation and application thereof without departing from the spirit of the disclosure. The contents of this specification therefore should not be construed as limiting the disclosure.

For example, in the description of the present disclosure, the terms "some embodiments," or "example," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

In the descriptions, with respect to circuit(s), unit(s), device(s), component(s), etc., in some occurrences singular forms are used, and in some other occurrences plural forms are used in the descriptions of various embodiments. It should be noted; however, the single or plural forms are not limiting but rather are for illustrative purposes. Unless it is expressly stated that a single unit, device, or component etc. is employed, or it is expressly stated that a plurality of units, devices or components, etc. are employed, the circuit(s), unit(s), device(s), component(s), etc. can be singular, or plural.

The various device components, circuits, modules, units, blocks, or portions can have modular configurations, or can be composed of discrete components, but nonetheless may be referred to as "modules" or "units" in general. In other words, the "components," "circuits," "modules," "units," "blocks," or "portions" referred to herein may or may not be provided in modular forms but can also include various alternative integrated configurations.

Based on various embodiments of the present disclosure, the disclosed apparatuses, devices, and methods can be implemented in other manners. For example, the abovementioned devices can employ various methods of use or implementation as disclosed herein.

Dividing the device into different "regions," "units," or "layers," etc. merely reflect various logical functions according to some embodiments, and actual implementations can have other divisions of "regions," "units," or "layers," etc. realizing similar functions as described above, or without divisions. For example, multiple regions, units, or layers, etc. can be combined or can be integrated into another system. In addition, some features can be omitted, and some steps in the methods can be skipped.

Those of ordinary skill in the art will appreciate that the units, regions, or layers, etc. in the devices provided by various embodiments described above can be provided in the one or more devices described above. They can also be located in one or multiple devices that is (are) different from the example embodiments described above or illustrated in the accompanying drawings. For example, the units, regions, or layers, etc. in various embodiments described above can be integrated into one module or divided into several submodules.

The order of the various embodiments described above are only for the purpose of illustration, and do not represent preference of embodiments.

Although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to the disclosed aspects of the exemplary embodiments can be made in addition to those described above by a person of ordinary skill in the art having the benefit of the present disclosure without departing from the spirit and scope of the disclosure contemplated by this disclosure and as defined in the following claims. As such, the scope of this disclosure is to be accorded the broadest reasonable interpretation so as to encompass such modifications and equivalent structures.

The invention claimed is:

1. A flat panel detector comprising:
   a base substrate;
   a sensing electrode over the substrate;
   a bias electrode over the substrate; and
   an insulating layer over the sensing electrode and the bias electrode at a side distal from the base substrate;
   wherein:
     the sensing electrode and the bias electrode are supported by the insulating layer;
     a difference between a thickness of a region of the insulating layer corresponding to the sensing electrode and a thickness of a region of the insulating layer corresponding to the bias electrode is not greater than a preset threshold;
     the thickness of the region of the insulating layer corresponding to the sensing electrode is a distance between a surface of the sensing electrode distal from the base substrate and a surface of the insulating layer distal from the base substrate;
     the thickness of the region of the insulating layer corresponding to the bias electrode is a distance between a surface of the bias electrode distal from the base substrate and the surface of the insulating layer distal from the base substrate;
     a thickness of the sensing electrode is smaller than a thickness of the bias electrode;
     a distance between a surface of the sensing electrode adjacent to the base substrate side and the base substrate is greater than a distance between a surface of the bias electrode adjacent to the base substrate side and the base substrate; and
     the thickness of the sensing electrode is a distance between a surface of the sensing electrode adjacent to the base substrate and a surface opposite from the base substrate, and the thickness of the bias electrode is a distance between a surface of the bias electrode adjacent to the base substrate and a surface opposite from the base substrate.

2. The flat panel detector according to claim 1, wherein a distance between a surface of the insulating layer being opposite from the base substrate and the base substrate is uniform.

3. The flat panel detector according to claim 1, wherein a work function of a material of a portion of the bias electrode in contact with the insulating layer is greater than a work function of a material of a portion of the sensing electrode in contact with the insulating layer.

4. The flat panel detector according to claim 3, wherein the bias electrode comprises a first conductive sublayer and a second conductive sublayer located on a side of the first conductive sublayer being opposite from the base substrate, and the first conductive sublayer is disposed in the same layer and is formed of the same material as the sensing electrode.

5. The flat panel detector of claim 4, wherein the material of the second conductive sublayer has a work function that is greater than a work function of the material of the first conductive sublayer.

6. The flat panel detector according to claim 1, wherein the preset threshold is not less than 0 and not more than 35 nm.

7. A manufacturing method of a flat panel detector, the method comprising:
  providing a base substrate;
  forming a bias electrode and a sensing electrode over the base substrate; and
  forming an insulating layer over the bias electrode and the sensing electrode;
  wherein:
    the flat panel detector further comprises a thin film transistor and a channel shielding layer;
    wherein:
    the thin film transistor is located on the base substrate;
    the channel shielding layer is located on a side of the thin film transistor being opposite from the base substrate;
    the channel shielding layer is configured to shield a channel region of the thin film transistor from illumination;
    the sensing electrode and the bias electrode are located on a side of the channel shielding layer being opposite from the base substrate; and
    an orthographic projection of the channel shielding layer on the base substrate overlaps at least a portion of an orthographic projection of the sensing electrode on the base substrate;
  the flat panel detector further comprises:
  a semiconductor layer located on a side of the insulating layer being opposite from the substrate; and
  a storage electrode located between the base substrate and the sensing electrode, the sensing electrode and the storage electrode forming a plate capacitor;
  the sensing electrode and the bias electrode are supported by the insulating layer;
  a difference between a thickness of a region of the insulating layer corresponding to the sensing electrode and a thickness of a region of the insulating layer corresponding to the bias electrode is not greater than a preset threshold;
  the thickness of the region of the insulating layer corresponding to the sensing electrode is a distance between a surface of the sensing electrode distal from the base substrate and a surface of the insulating layer distal from the base substrate;
  the thickness of the region of the insulating layer corresponding to the bias electrode is a distance between a surface of the bias electrode distal from the base substrate and the surface of the insulating layer distal from the base substrate;
  a thickness of the sensing electrode is smaller than a thickness of the bias electrode; and the thickness of the sensing electrode is a distance between a surface of the sensing electrode adjacent to the base substrate and a surface opposite from the base substrate, and the thickness of the bias electrode is a distance between a surface of the bias electrode adjacent to the base substrate and a surface opposite from the base substrate.

8. The method according to claim 7, wherein a distance between a surface of the sensing electrode adjacent to the base substrate side and the base substrate is greater than a distance between a surface of the bias electrode adjacent to the base substrate side and the base substrate.

9. The method according to claim 8, wherein the insulating layer is formed on a side of the bias electrode and the sensing electrode being opposite from the base substrate, comprising:
  forming an insulating layer on a side of the bias electrode and the sensing electrode being opposite from the base substrate, and a distance between a surface of the insulating layer being opposite from the base substrate and the base substrate is uniform.

10. The method according to claim 8, wherein making bias electrode and sensing electrode on the base substrate comprises:
  forming a sensing electrode on the base substrate;
  forming a bias electrode on the base substrate with a material having a work function larger than that of the sensing electrode, such that a material of a portion of the bias electrode in contact with the insulating layer has a work function greater than the work function of a material of the portion of the sensing electrode in contact with the insulating layer.

11. The method according to claim 10, wherein the bias electrode comprises a first conductive sublayer and a second conductive sublayer, and the bias electrodes and sensing electrodes are formed on the base substrate, including:
  forming a first film layer on the base substrate with a first material;
  forming the first film layer into the sensing electrode and the first conductive sublayer by a patterning process of one-time pattern;
  forming, by the second material, a second film layer on a side of the first conductive sublayer being opposite from the base substrate, wherein a work function of the second material is greater than a work function of the first material;
  wherein, the second film layer is subjected to a patterning process to form the second conductive sublayer, wherein the first conductive sublayer and the second conductive sublayer constitute a bias electrode.

12. A flat panel detector comprising:
  a base substrate;
  a sensing electrode over the base substrate;
  a bias electrode over the base substrate;
  an insulating layer over the sensing electrode and the bias electrode;
  a semiconductor layer located on a side of the insulating layer being opposite from the substrate; and
  a storage electrode, the storage electrode being located between the base substrate and the sensing electrode, and the sensing electrode and the storage electrode forming a plate capacitor;
  wherein:
  the sensing electrode and the bias electrode are supported by the insulating layer;
  a difference between a thickness of a region of the insulating layer corresponding to the sensing electrode and a thickness of a region of the insulating layer corresponding to the bias electrode is not greater than a preset threshold;

the thickness of the region of the insulating layer corresponding to the sensing electrode is a distance between a surface of the sensing electrode distal from the base substrate and a surface of the insulating layer distal from the base substrate;

the thickness of the region of the insulating layer corresponding to the bias electrode is a distance between a surface of the bias electrode distal from the base substrate and the surface of the insulating layer distal from the base substrate;

the difference of a distance between a surface of the sensing electrode being opposite from the base substrate side and the base substrate and a distance between a surface of the bias electrode being opposite from the base substrate and the base substrate is not greater than the preset threshold;

the thickness of the sensing electrode is smaller than the thickness of the bias electrode;

a thickness of the insulating layer being described as a distance between a surface of the insulating layer being opposite from the base substrate and the base substrate is uniform;

a distance between a surface of the sensing electrode adjacent to the base substrate side and the base substrate is greater than a distance between a surface of the bias electrode adjacent to the base substrate side and the base substrate;

the thickness of the sensing electrode is a distance between a surface of the sensing electrode adjacent to the base substrate and a surface opposite from the base substrate, and the thickness of the bias electrode is a distance between a surface of the bias electrode adjacent to the base substrate and a surface opposite from the base substrate; and a work function of a material of a portion of the bias electrode in contact with the insulating layer is greater than a work function of a material of a portion of the sensing electrode in contact with the insulating layer.

13. The flat panel detector according to claim 12, wherein:

the bias electrode comprises a first conductive sublayer and a second conductive sublayer located on a side of the first conductive sublayer being opposite from the base substrate; and the first conductive sublayer is disposed in the same layer and is formed of the same material as the sensing electrode.

14. The flat panel detector of claim 13, wherein the material of the second conductive sublayer has a work function that is greater than a work function of the material of the first conductive sublayer.

15. The flat panel detector according claim 12, further comprising a thin film transistor and a channel shielding layer;

wherein:

the thin film transistor is located on the base substrate;

the channel shielding layer is located on a side of the thin film transistor being opposite from the base substrate;

the channel shielding layer is configured to block a channel region of the thin film transistor;

the sensing electrode and the bias electrode are located on a side of the channel shielding layer being opposite from the base substrate;

an orthographic projection of the channel shielding layer on the base substrate overlaps at least a portion of an orthographic projection of the sensing electrode on the base substrate; and the predetermined threshold is not less than 0 and not more than 35 nm.

* * * * *